United States Patent
Kuo

[11] Patent Number: 5,947,192
[45] Date of Patent: Sep. 7, 1999

[54] STACK-FIN RADIATOR

[75] Inventor: Dah-Chyi Kuo, Taipei, Taiwan

[73] Assignee: Chaun-Choung Industrial Corp., Taipei, Taiwan

[21] Appl. No.: 09/133,193

[22] Filed: Aug. 13, 1998

[51] Int. Cl.[6] .................................................. H05K 7/20
[52] U.S. Cl. ...................... 165/80.3; 165/121; 165/185; 174/16.3; 257/722; 361/697; 361/704
[58] Field of Search .................... 165/80.3, 185, 165/121; 174/16.3; 257/722; 361/690, 703, 704, 695, 697

[56] References Cited

U.S. PATENT DOCUMENTS

| | | | |
|---|---|---|---|
| 4,009,752 | 3/1977 | Wilson | 165/185 X |
| 5,509,465 | 4/1996 | Lai | 165/80.3 |
| 5,558,155 | 9/1996 | Ito | 165/80.3 |
| 5,706,169 | 1/1998 | Yeh | 361/690 |
| 5,818,694 | 10/1998 | Daikoku et al. | 361/703 |

*Primary Examiner*—Leonard Leo
*Attorney, Agent, or Firm*—Rosenberg, Klein & Bilker

[57] ABSTRACT

A stack-fin radiator comprises a base and a fin set. One surface of the base is separated into a central first portion and two second portions on the two sides of the first portion. The fin set formed by a first fin unit and a second fin unit, the first and second fin units are formed by stacking a plurality of first fins and second fins. Connecting pieces being used to penetrate the first fins and the second fins so that the first fins and the second fins are connected in series, the first fins and second fins are also fixed on the respective first and second portions of the base. By the aforementioned structure, the stack-fin radiator with high heat dissipation efficiency, higher mold cost and of easily manufacturing are achieved.

7 Claims, 5 Drawing Sheets

STACK-FIN RADIATOR

BACKGROUND OF THE INVENTION

1. Field of the Invention

The present invention relates to a stack-fin radiator, especially to a radiator structure suitable for a computer housing.

2. Background of the Invention

The radiator is a heat dissipating device used in the CPU of a computer (central processing unit) or electronic components. The prior art radiator is made of aluminum, copper and other materials with good conductivity by compressing aluminum pieces or pressing molding. The prior art radiator includes a base and a polarity of fins connected with the base. In order that the radiator has a preferred heat dissipating effect, in generally a fan is combined with the radiator for increasing the heat dissipating efficiency.

However, since aforementioned prior art radiator are made by pressing aluminum or molding, it is necessary to generate a mold, thus it is not easy to be modified and the cost is high. For the radiator made by pressing aluminum, because of the confinement of manufacturing conditions, the ratios of the gap, width, and height of the radiator have their extreme values. The high density and large area requirements can not be achieved. For the radiator made by molding, since during using a molding mold, it is confined by the size of the flow path, the ratio of the length to width of the fin is also confined.

Further, if the prior radiator is used in a computer housing, in order to match the requirement of the computer housing, the radiator needs to be designed with a long shape, so that a hollow space is formed between the fins. Thus the gas flow generated by the fan is easy to flow outwards and is difficult to be transferred to the fins on the left and right sides of the long radiator. Thus the heat dissipation efficiency of the radiator will be greatly reduced. Therefore, it is apparently that there are some defects in the prior art radiator.

SUMMARY OF THE INVENTION

Accordingly, the object of the present invention is to provide a stack-fin radiator comprises a base and a fin set. One surface of base is separated into a central first portion and two second portions on the two sides of the second central portion. The fin set is formed by a first fin unit and a second fin unit. The first and second fin units are formed by stacking a plurality of first fins and second fins, connecting pieces being used to penetrate the first fins and the second fins so that the first fins and the second fins are connected in series. The first fins and second fins are also fixed on the respective first and second portions of the base. Thus a radiator is formed. It is easy to be shaped, varied and manufactured, and further finishing is unnecessary. The cost of mold is cheap. The fin set 20 is formed by assembly. The gap, width and height of the fins 23 and 28 of the fin set 20 are not limited, they may be varied as required. Thus a higher density and a large area for dissipating heat may be obtained.

A further object of the present invention is to provide a stack-fin radiator, wherein wind channels can be formed between the second fins along the length of the base. Therefore, as the fan is driven to operate, the gas flow could enter into the wind channel of the second fins unit. Thus, the gas may be transferred to the second fins on the right and left sides of the radiators of a long radiator and the heat dissipating efficiency of the radiator is improved.

The present invention will be better understood and its numerous objects and advantages will become apparent to those skilled in the art by referencing to the following drawings in which:

DETAILED DESCRIPTION OF THE PREFERRED EMBODIMENT

Figure 1:
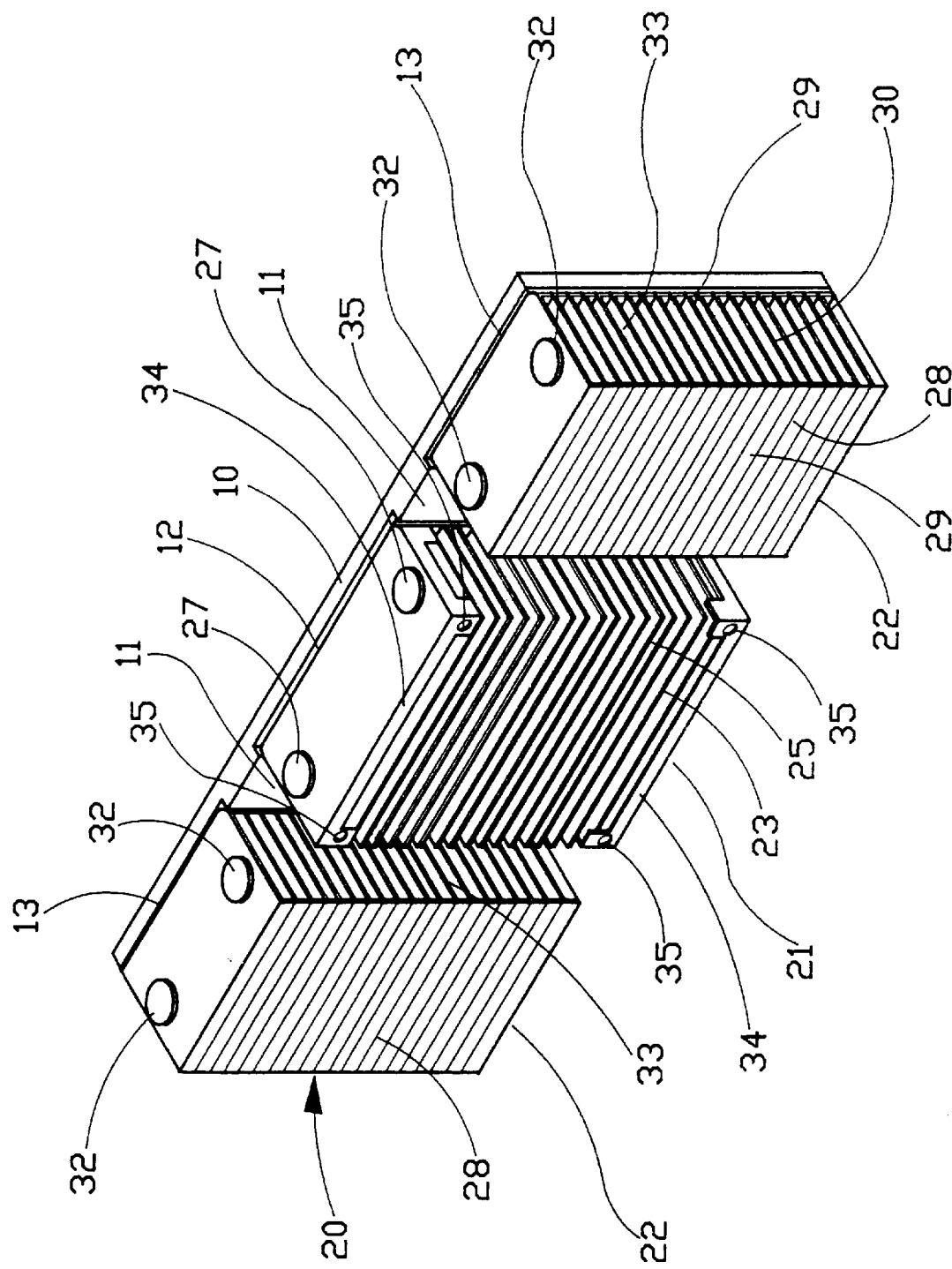
FIG. 1 is a perspective view of the present invention.
Figure 2:
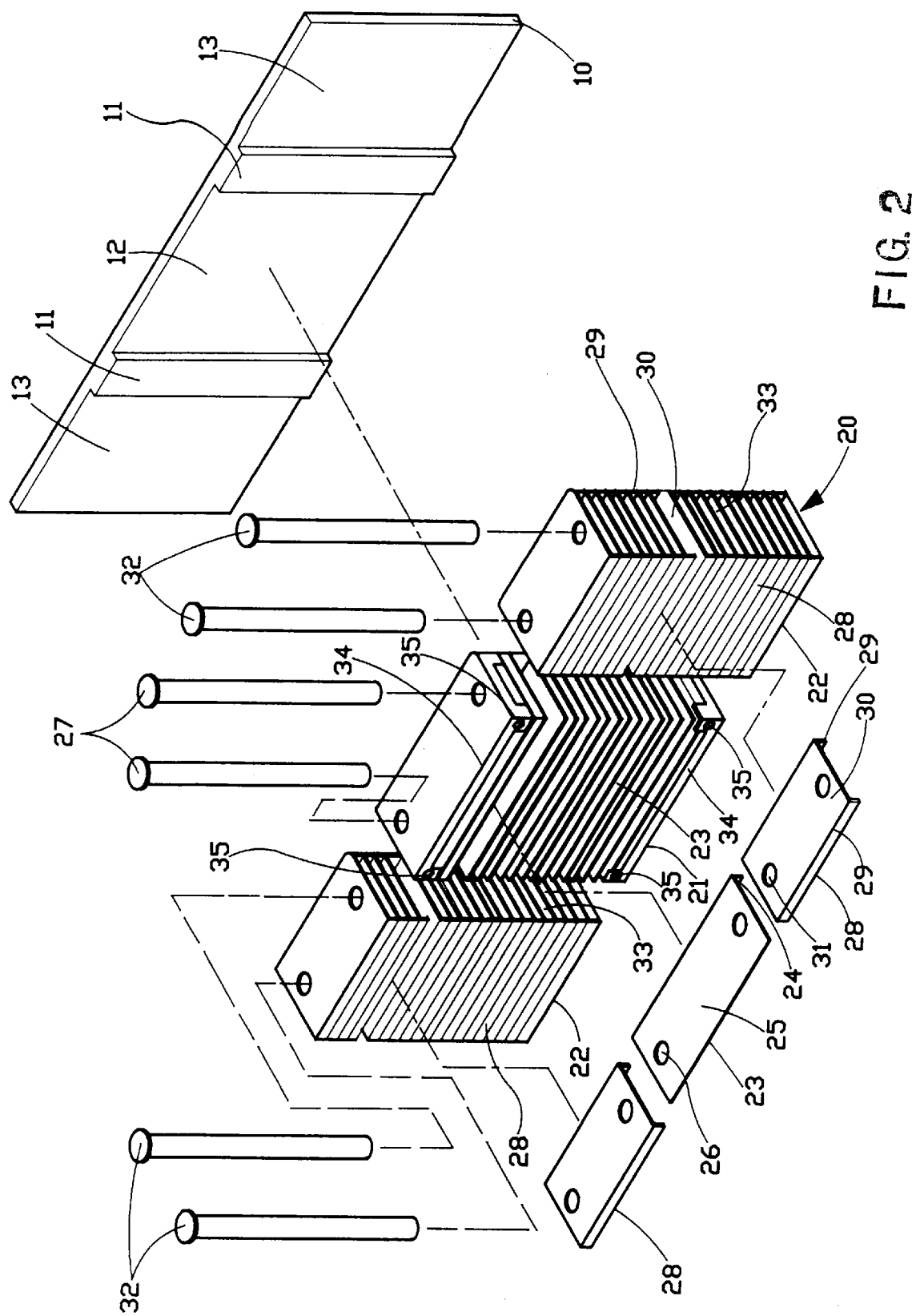
FIG. 2 is an exploded view of the present invention.

As that shown in FIGS. 1 and 2, the stack-fin radiator of the present invention comprises a base 10 and a fin set 20. The base 10 is made by aluminum, copper or other material having good conductivity. The base 10 is a rectangular plate body with one surface thereof is installed with two convex strips 11 along the width of the base 19 so that by the two convex strips 11, the surface of the base 10 having the convex strips are divided into three portions, a first portion 12 and two second portions 13 on the two sides of the first portion.

The fin set 20 is formed by a first fin unit 21 and a second fin unit 22. The first fin unit is formed by stacking a plurality of first fins 23 having a L shape, and the first fins 23 are made by aluminum, copper or other material with good conductivity. The first fin 23 has a vertical portion 24 and a horizontal portion 25. The vertical portion 24 and the horizontal portion 25 are connected vertically and two through holes 26 are installed on the horizontal portion 25. The first fins 23 of the first fin unit 21 are stacked in order so that the horizontal portions 25 of the first fins 23 are arranged with an equal space therebetween. By using two connecting pieces 27 (rivets) to penetrate through the two through holes 26 of the first fins 23, the first fins are connected together in series. The first fin unit 21 may be fixed on the base 10 by the vertical portions 24 of the first fins 23, wherein the vertical portions 24 of the first fins 23 are fixedly stuck on the first portion 12 of the base 10 by a thermal conducting glue.

The second fin unit 22 is formed by stacking a plurality of second fins 28 having a U shape. and the second fins 28 are made by aluminum, copper or other material with good conductivity. The second fin 28 has vertical portions 29 and horizontal portion 30. The vertical portions 29 and the horizontal portion 30 are connected vertically and two through holes 31 are installed on the horizontal portion 30. The second fins 28 of the second fin unit 22 are stacked in order so that the horizontal portions 30 of the second fins 28 are arranged with an equal space. By using two connecting pieces 32 (rivets) to penetrate through the two through holes 31 of the second fins 28, the first fins are connected together in series. Since vertical portions 29 are formed on the inner and outer ends of the second fins 29, the left and right wind channels 33 are formed within the second fins 28. The second fin unit 22 may be fixed on the base 10 by the vertical portions 29 of the second fins 28, wherein the vertical portions 29 of the second fins 28 are fixedly stuck on the second portion 13 of the base 10 by a thermal conducting glue.

Another, in the present invention, Each of the upper and lower sides of the first fin unit 21 of the fin set 20 is combined with a thick fixing frame 34. Two fixing holes 35 are formed in each of the fixing frame 34, thereby the fixing frame 34 may connected on the fixing holes 35 of the fixing frame 34 by screws 41 so to penetrate through the four corners of the fan 40. Thus the screw of the fan 40 may be locked on the first fin unit 21 of the fin set 20. Of course, in the present invention, other ways for fixing the fan on the radiator may be used, and other buckling devices may be used to fix the fan on the radiator.

Figure 4:
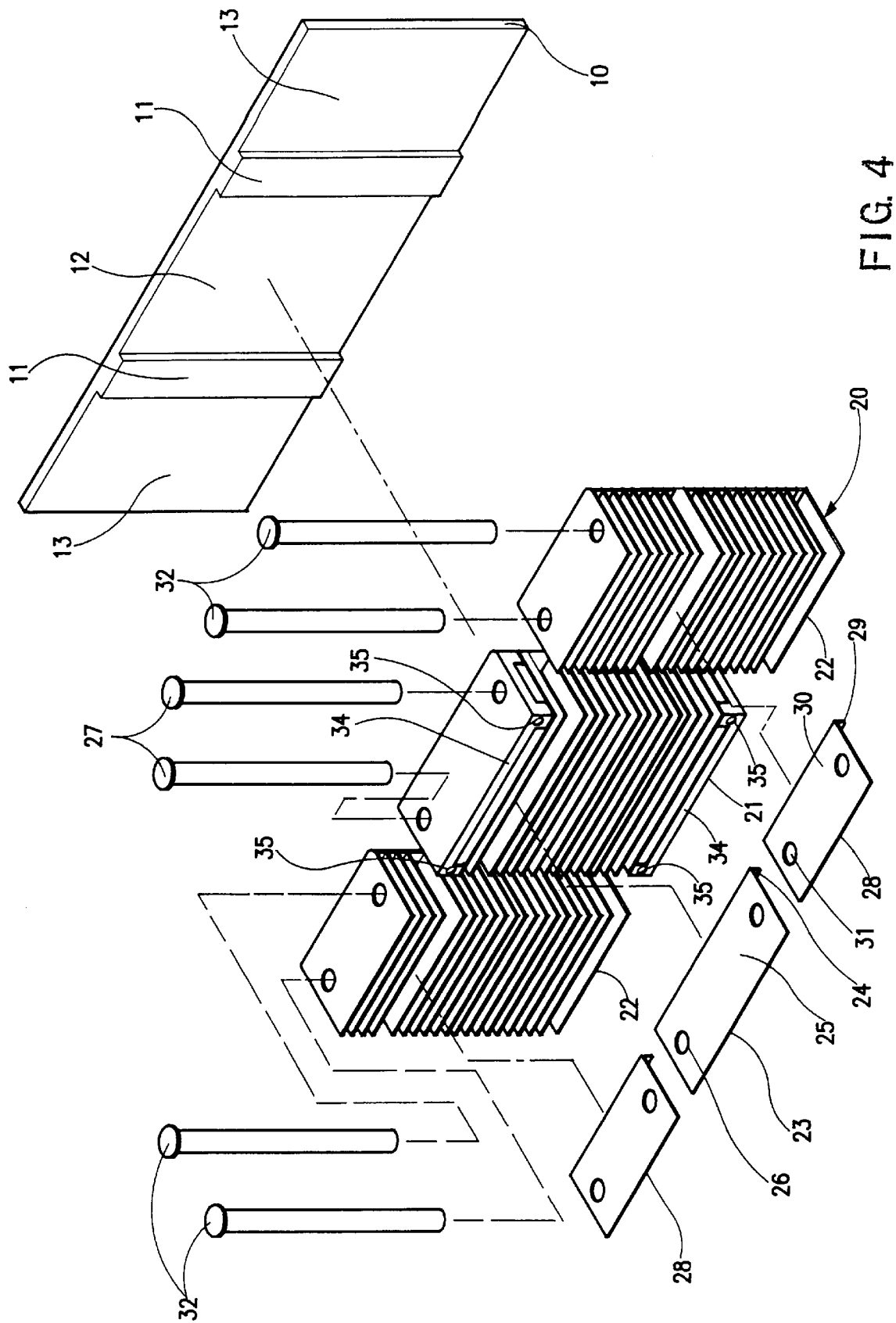
FIG. 4 is an exploded view of a embodiment of the present invention.

Another, as shown in FIG. 4, the second fin 28 of the second fin unit 22 may has a L shape. The second fin 28 only has a vertical portion 29 and a horizontal portion 30. Since the outer end of the second fin is installed with a vertical portion, wind channels will not formed within the second fins 28.

Figure 3:
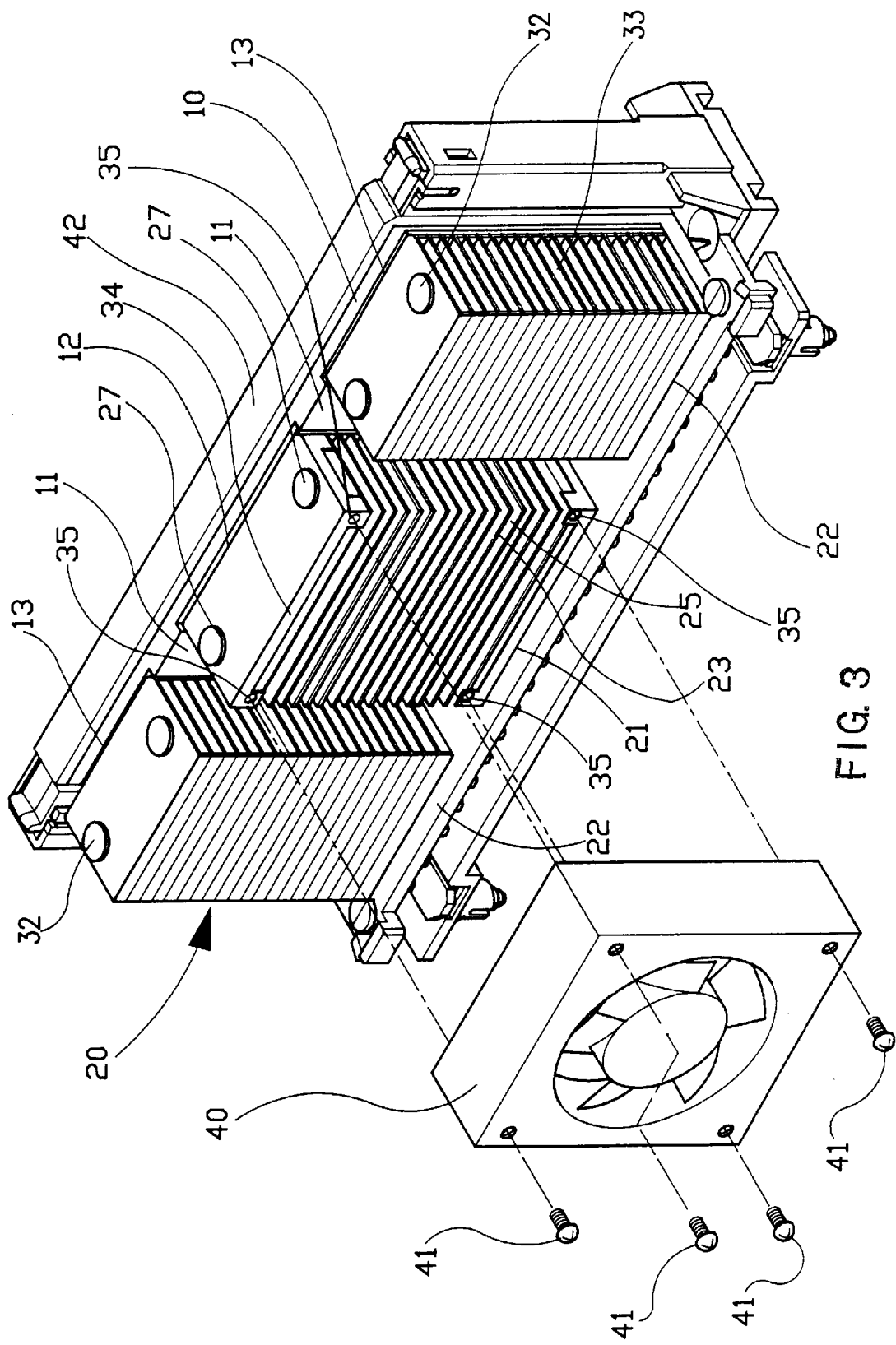
FIG. 3 is a schematic view shown that the present invention is matched with a CPU.

As shown in FIG. 3, the radiator of the present invention may be arranged on the surface of a stand CPU 42 for increasing the heat dissipation of the CPU 42. In the radiator of the present invention, the fin set 20 is made by metal pieces. It is easy to be shaped, varied and manufactured, further finishing work is unnecessary. The cost of mold is cheap. The fin set 20 is formed by assembly. The gap, width and height of the fins 23 and 28 of the fin set 20 are not limited, they may be varied as required. Thus a higher density and a large area for dissipating heat may be obtained.

Moreover, in the second fin unit 22, on the two sides of the base 10 of the present invention, wind channels can be formed between the second fins 28 along the length of the base 10 (as shown in FIG. 3). Therefore, as the fan is driven to operate, when the gas flow generated by the fan 40 flows to the tight and left sides through the first fins 23 of the first fin unit 21 of the fin set 20, the gas flow could enter into the wind channel 33 of the second fins unit 22 and can not flow outwards. Thus, the gas may be transferred to the second fins 28 on the right and left sides of the radiators and the heat dissipating efficiency of the radiator is improved.

Figure 5:
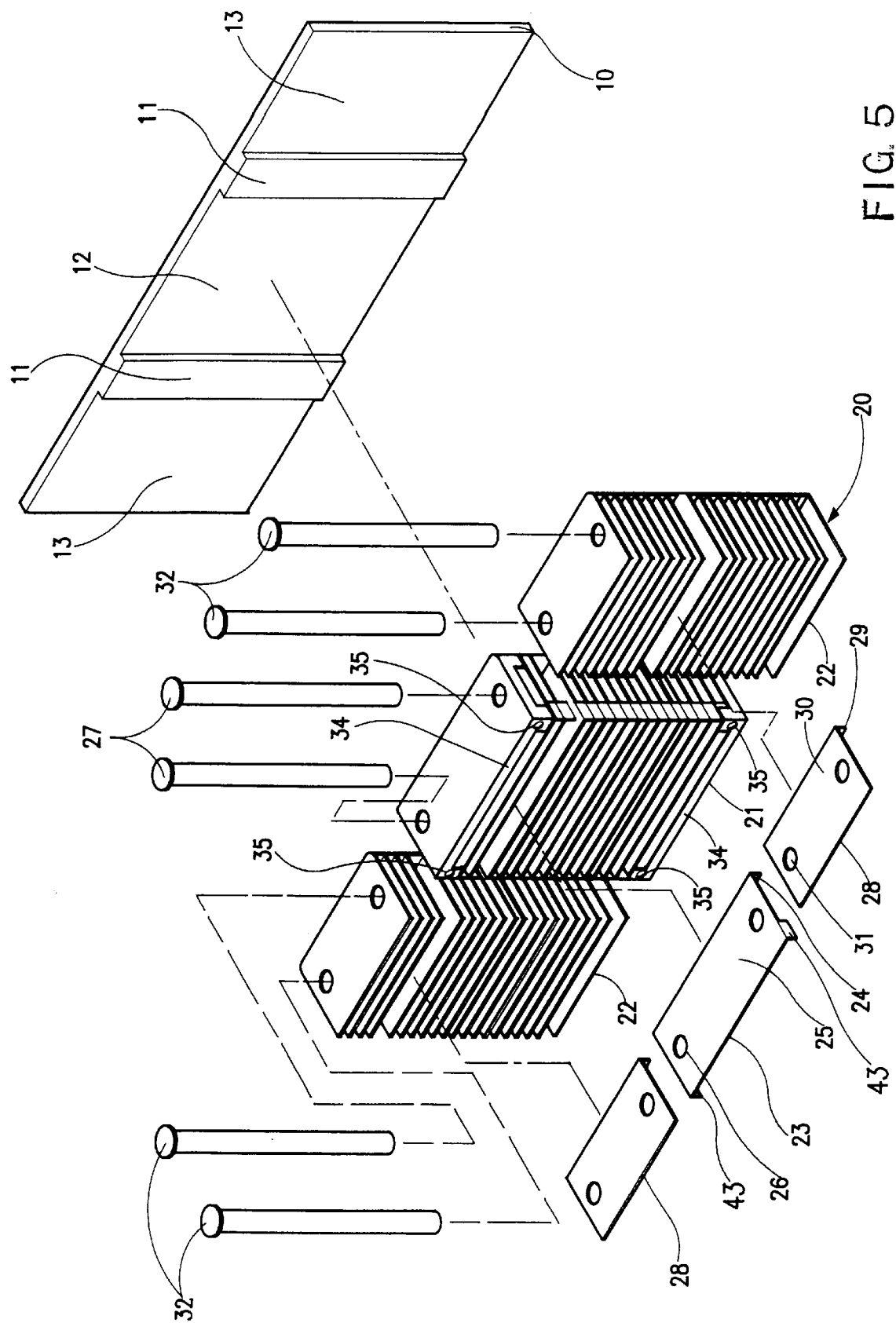
FIG. 5 is an exploded view of a further embodiment of the present invention.

Another, as shown in FIG. 5, lateral pieces 43 may be installed on the left and right sides of the horizontal portion 25 of the first fins 23. The lateral pieces 43 have the same height as the vertical portions 24. The lateral pieces will form a wind guide wall so to guide the gas flow generated by the fan and cause the gas will not flow outwards, thus it may enter into the inner portion of the unit. Then the gas flows out from the lower opening and enter into the second fin unit. By the control the flow path, the heat exchange efficiency between the fin unit and the gas flow can be improved. Meanwhile, the lateral pieces 43 will cause that the stack of the first fins become steadier.

Accordingly, the stack-fin radiator of the present invention has improved the defect in the prior art—low heat dissipation efficiency, higher mold cost and limited manufacturing conditions. Although the invention has been described in detail with reference only to a preferred embodiment those skilled in the art will appreciate that various modifications can be made without departing from the invention. Accordingly, the invention is defined only by the following claims which are intended to embrace all equivalent thereof.

Description of the Numerals in Figures

| | |
|---|---|
| 10 base | 11 convex strip |
| 12 first portion | 13 second portion |
| 20 fin set | 21 first fin unit |
| 22 second fin unit | 23 first fins |
| 24 vertical portion | 25 horizontal portion |
| 26 through hole | 27 connecting piece |
| 28 second fins | 29 vertical portion |
| 30 horizontal portion | 31 through hole |
| 32 connecting piece | 33 wind channel |
| 34 fixing frame | 35 fixing hole |
| 40 fan | 41 screw |
| 42 CPU | 43 lateral piece |

What is claimed is:

1. A heat dissipation system comprising:
  (a) a base having a first surface portion and a second surface portion disposed in substantially coplanar manner;
  (b) a first fin unit coupled to said first surface portion of said base, said first fin unit including a plurality of stacked first fin members coupled together by at least one connecting piece passing therethrough, each said first fin member having a vertical portion and a substantially planar horizontal portion projecting therefrom, said horizontal portions of adjacent ones of said first fin members being spaced one from the other; and,
  (c) at least one second fin unit coupled to said second surface portion of said base, said second fin unit including a plurality of stacked second fin members coupled together by at least one connecting piece passing therethrough, each said second fin member having a pair of opposed vertical portions and a substantially planar horizontal portion extending therebetween, said horizontal portions of adjacent ones of said second fin members being spaced one from the other.

2. The heat dissipation system as recited in claim 1 wherein said base includes at least one convex strip extending between said first and second surface portions.

3. The heat dissipation system as recited in claim 1 wherein each of said first and second fin members is coupled to said base portion by a thermal conducting adhesive means.

4. The heat dissipation system as recited in claim 1 wherein said first fin unit includes at least an upper fixing frame and a lower fixing frame coupled to said stacked first fin members, each of said upper and lower fixing frames having at least a pair of mounting holes, said upper and lower fixing frames being adapted to cooperatively support the mounting of a fan assembly thereto.

5. A heat dissipation system comprising:
  (a) a base having a first surface portion and a pair of second surface portions disposed in substantially coplanar manner;
  (b) a first fin unit coupled to said first surface portion of said base, said first fin unit including a plurality of stacked first fin members coupled together by at least one connecting piece passing therethrough, each said first fin member having a vertical portion and a substantially planar horizontal portion projecting therefrom, said horizontal portions of adjacent ones of said first fin members being spaced one from the other; and,
  (c) at least a pair of second fin units coupled respectively to said second surface portions of said base, each said second fin unit including a plurality of stacked second fin members coupled together by at least one connecting piece passing therethrough, each said second fin member having a pair of opposed vertical portions and a substantially planar horizontal portion extending therebetween, said horizontal portions of said second fin members of one said second fin unit being disposed in mutually spaced manner to collectively define a left wind channel, said horizontal portions of said second fin members of the other said second fin unit being disposed in mutually spaced manner to collectively define a right wind channel.

6. The heat dissipation system as recited in claim 5 wherein said base includes at least a pair of convex strips, each said convex strip extending between said first surface portion and one of said second surface portions.

7. A heat dissipation system comprising:

(a) a base having a first surface portion and a pair of second surface portions disposed in substantially coplanar manner;

(b) a first fin unit coupled to said first surface portion of said base, said first fin unit including a plurality of stacked first fin members coupled together by at least one connecting piece passing therethrough, each said first fin member having a vertical portion and a substantially planar horizontal portion projecting therefrom, each said first fin member having at least a pair of substantially opposed lateral pieces extending vertically from said horizontal portion, said horizontal portions of adjacent ones of said first fin members being spaced one from the other; and, (c) at least a pair of second fin units coupled respectively to said second surface portions of said base, each said second fin unit including a plurality of stacked second fin members coupled together by at least one connecting piece passing therethrough, each said second fin member having a pair of opposed vertical portions and a substantially planar horizontal portion extending therebetween, said horizontal portions of said second fin members of one said second fin unit being disposed in mutually spaced manner to collectively define a left wind channel, said horizontal portions of said second fin members of the other said second fin unit being disposed in mutually spaced manner to collectively define a right wind channel.

* * * * *